US009627351B2

(12) United States Patent
Bilenko et al.

(10) Patent No.: US 9,627,351 B2
(45) Date of Patent: *Apr. 18, 2017

(54) DEVICE ELECTRODE FORMATION USING METAL SHEET

(71) Applicant: Sensor Electronic Technology, Inc., Columbia, SC (US)

(72) Inventors: Yuri Bilenko, Columbia, SC (US); Michael Shur, Latham, NY (US); Remigijus Gaska, Columbia, SC (US); Alexander Dobrinsky, Loudonville, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/834,606

(22) Filed: Aug. 25, 2015

(65) Prior Publication Data
US 2015/0364443 A1 Dec. 17, 2015

Related U.S. Application Data

(63) Continuation-in-part of application No. 14/059,664, filed on Oct. 22, 2013, now Pat. No. 9,117,983.
(Continued)

(51) Int. Cl.
*H01L 29/24* (2006.01)
*H01L 23/00* (2006.01)
(Continued)

(52) U.S. Cl.
CPC .............. *H01L 24/94* (2013.01); *H01L 21/78* (2013.01); *H01L 23/49541* (2013.01);
(Continued)

(58) Field of Classification Search
CPC ....... H01L 2924/13; H01L 2924/12041; H01L 2933/0066; H01L 2924/12;
(Continued)

(56) References Cited

U.S. PATENT DOCUMENTS 6,531,328 B1   3/2003   Chen
7,772,019 B2   8/2010   Tsou
(Continued)

FOREIGN PATENT DOCUMENTS

JP   2000260206 A   9/2000
JP   2008300553 A   12/2008
(Continued)

OTHER PUBLICATIONS

Park, PCT Search Report for Application No. US2013/066035, Jan. 28, 2014, 10 pages.
(Continued)

*Primary Examiner* — John C Ingham
*Assistant Examiner* — Didarul Mazumder
(74) *Attorney, Agent, or Firm* — LaBatt, LLC

(57) ABSTRACT

A solution for packaging a two terminal device, such as a light emitting diode, is provided. In one embodiment, a method of packaging a two terminal device includes: patterning a metal sheet to include a plurality of openings; bonding at least one two terminal device to the metal sheet, wherein a first opening corresponds to a distance between a first contact and a second contact of the at least one two terminal device; and cutting the metal sheet around each of the least one two terminal device, wherein the metal sheet forms a first electrode to the first contact and a second electrode to the second contact.

18 Claims, 16 Drawing Sheets

Related U.S. Application Data

(60) Provisional application No. 61/716,655, filed on Oct. 22, 2012.

(51) Int. Cl.
| | | |
|---|---|---|
| *H01L 33/62* | (2010.01) | |
| *H01L 25/07* | (2006.01) | |
| *H01L 21/78* | (2006.01) | |
| *H01L 33/52* | (2010.01) | |
| *H01L 23/495* | (2006.01) | |
| *H01L 33/60* | (2010.01) | |

(52) U.S. Cl.
CPC .. *H01L 23/49562* (2013.01); *H01L 23/49575* (2013.01); *H01L 25/072* (2013.01); *H01L 33/52* (2013.01); *H01L 33/62* (2013.01); *H01L 24/81* (2013.01); *H01L 33/60* (2013.01); *H01L 2224/0401* (2013.01); *H01L 2224/06102* (2013.01); *H01L 2224/1403* (2013.01); *H01L 2224/16245* (2013.01); *H01L 2224/81191* (2013.01); *H01L 2224/94* (2013.01); *H01L 2924/01322* (2013.01); *H01L 2924/12* (2013.01); *H01L 2924/12035* (2013.01); *H01L 2924/12041* (2013.01); *H01L 2924/12042* (2013.01); *H01L 2924/13* (2013.01); *H01L 2933/0066* (2013.01)

(58) Field of Classification Search
CPC ....... H01L 2924/12035; H01L 2924/00; H01L 2224/94; H01L 2224/81; H01L 2924/01322; H01L 2924/12042
USPC ...... 257/79, 88; 438/22, 24, 46, 47; 362/294
See application file for complete search history.

(56) References Cited

U.S. PATENT DOCUMENTS

| | | | | |
|---|---|---|---|---|
| 9,117,983 | B2 * | 8/2015 | Bilenko | ................. H01L 24/94 |
| 2005/0199899 | A1 | 9/2005 | Lin et al. | |
| 2006/0261357 | A1 * | 11/2006 | Tsou | ....................... H01L 24/73 |
| | | | | 257/88 |
| 2007/0145383 | A1 | 6/2007 | Rho et al. | |
| 2009/0166664 | A1 | 7/2009 | Park et al. | |
| 2010/0038662 | A1 * | 2/2010 | Fushimi | ................. H01L 33/62 |
| | | | | 257/98 |
| 2010/0187546 | A1 * | 7/2010 | Fushimi | ................. H01L 33/62 |
| | | | | 257/88 |
| 2011/0116271 | A1 * | 5/2011 | Ide | ........................ H01L 33/486 |
| | | | | 362/294 |
| 2011/0260646 | A1 * | 10/2011 | Moon | ................. H01L 25/0753 |
| | | | | 315/294 |
| 2012/0313115 | A1 * | 12/2012 | Joo | ....................... H01L 33/486 |
| | | | | 257/88 |
| 2013/0056770 | A1 | 3/2013 | Shatalov et al. | |
| 2013/0078411 | A1 | 3/2013 | Gaska et al. | |

FOREIGN PATENT DOCUMENTS

| | | |
|---|---|---|
| JP | 2010045265 A | 2/2010 |
| KR | 20-0234768 | 9/2001 |
| KR | 20090072941 A | 7/2009 |
| KR | 20110015824 A | 2/2011 |

OTHER PUBLICATIONS

Majdi, Arash, U.S. Appl. No. 14/059,664, Notice of Allowance, Apr. 15, 2015, 15 pages.
Majdi, Arash, U.S. Appl. No. 14/059,664, Non-Final Office Action, Oct. 6, 2014, 22 pages.
Korean Application No. 10-2015-7013677, Office Action (with English translation), Jul. 6, 2016, 16 pages.
Korean Application No. 10-2015-7013677, Office Action (with English translation), Nov. 1, 2016, 5 pages.
Chen, Y., Chinese Application No. 201380055363.9, Office Action1 (with English translation), Nov. 4, 2016, 15 pages.

* cited by examiner

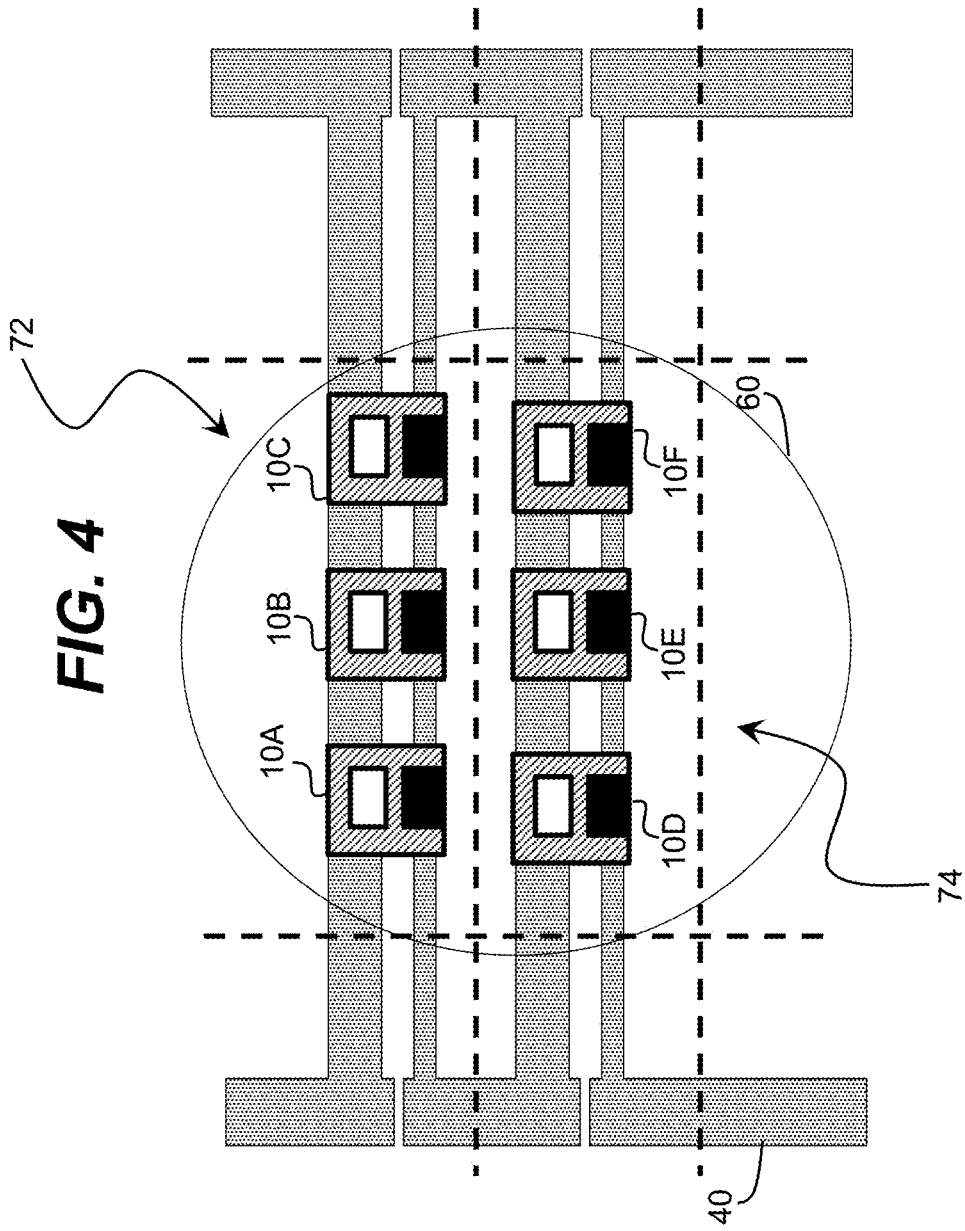

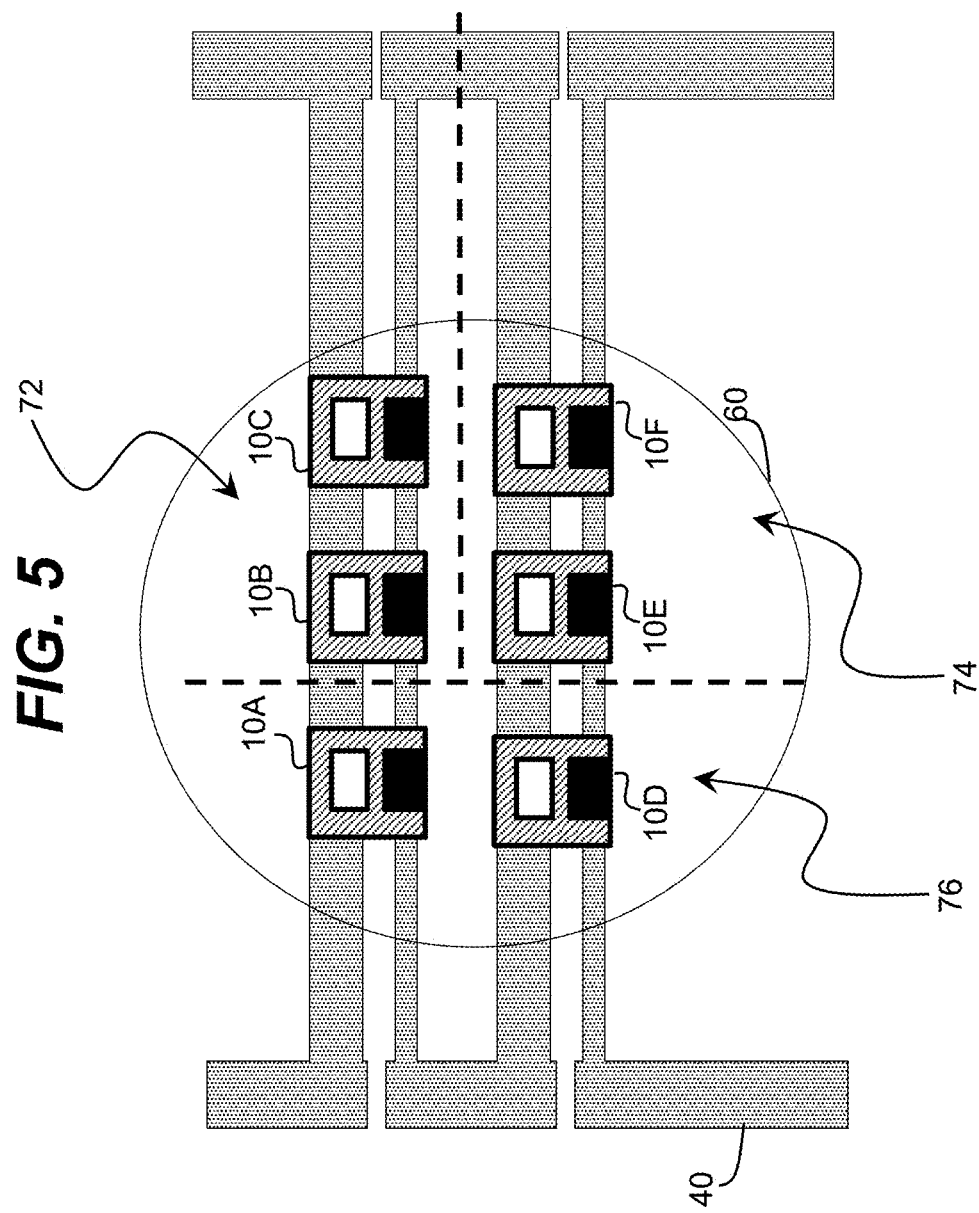

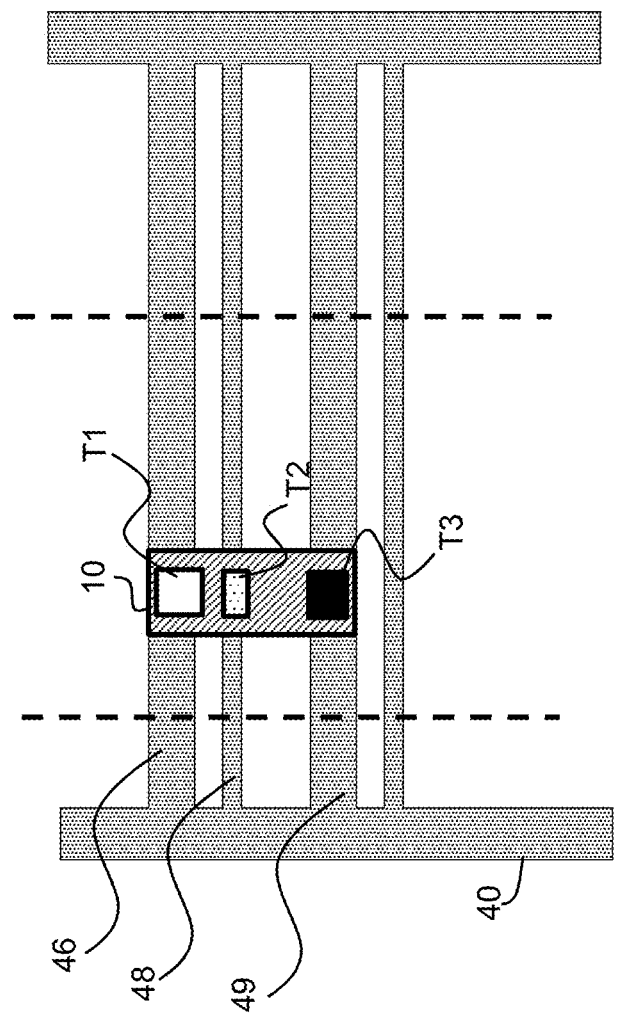

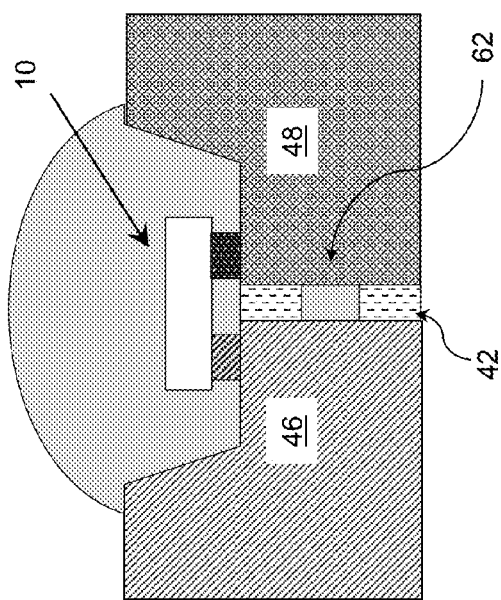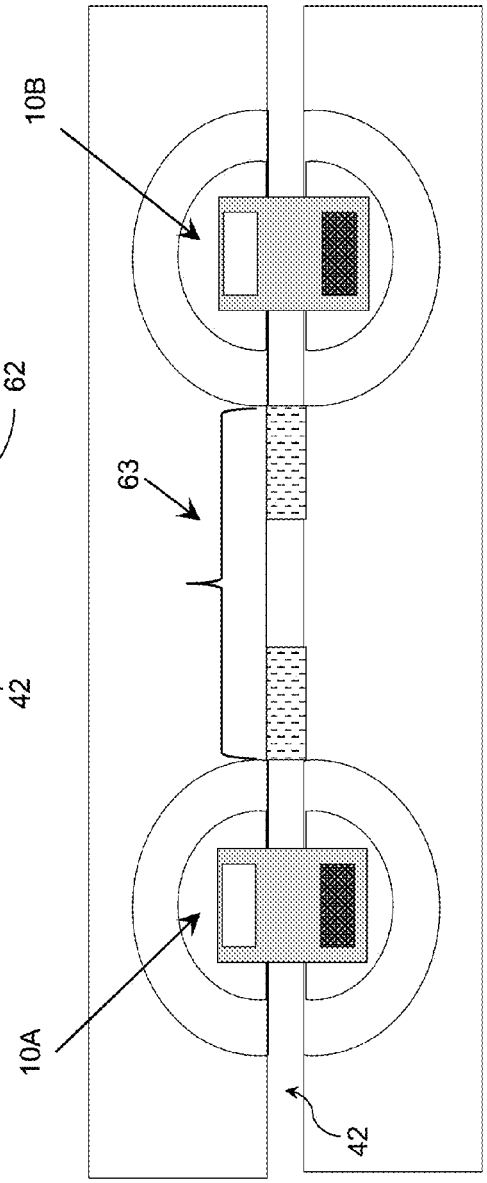

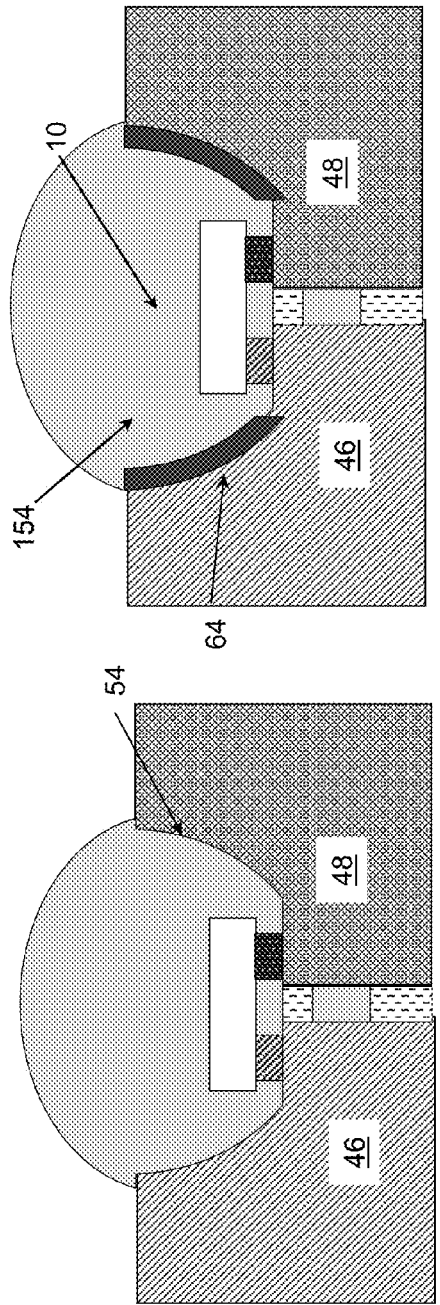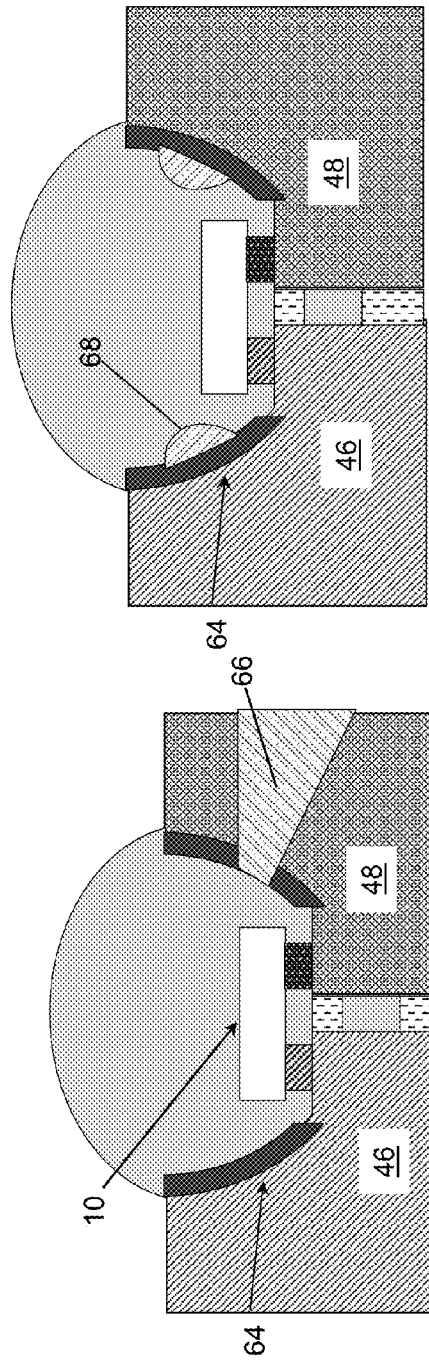
FIG. 15A  FIG. 15B  FIG. 15C  FIG. 15D

DEVICE ELECTRODE FORMATION USING METAL SHEET

REFERENCE TO RELATED APPLICATIONS

The current application is a continuation-in-part application of U.S. application Ser. No. 14/059,664, which was filed on 22 Oct. 2013, which claims the benefit of U.S. Provisional Application No. 61/716,655, titled "Two Terminal Packaging Method," which was filed on 22 Oct. 2012, both of which are hereby incorporated by reference.

TECHNICAL FIELD

The disclosure relates generally to two terminal devices, and more particularly, to a solution for packaging a two terminal device, such as a light emitting diode.

BACKGROUND ART

There are various approaches to packaging light emitting diodes (LEDs). One method of packaging an LED includes providing a substrate cavity, forming an electrode layer on the surface of the substrate cavity, and then forming an opening within the cavity. An anode and a cathode are separated by the formation of the opening. A LED chip is placed at the bottom of the cavity and over the opening. The LED chip is electrically connected to the anode and the cathode. The formed cavity is filled with packaging material. An individual LED device is formed by a cutting process and cutting along a cutting line in the cavity.

Another approach provides a package array and a package unit of a flip chip LED. An LED chip is mounted on a ceramic material that is capable of enduring the eutectic temperature of the fabrication process for packaging. A plurality of metal wires are directly distributed on the ceramic material to finish an LED package unit, or a plurality of LEDS are connected in series or in parallel with the metal wires on the ceramic material to finish the high density package array.

SUMMARY OF THE INVENTION

Aspects of the invention provide an improved solution for packaging a two terminal device, such as a LED. In one embodiment, a method of packaging a two terminal device includes: patterning a metal sheet to include a plurality of openings; bonding at least one two terminal device to the metal sheet, wherein a first opening corresponds to a distance between a first contact and a second contact of the at least one two terminal device; and cutting the metal sheet around each of the least one two terminal device, wherein the metal sheet forms a first electrode to the first contact and a second electrode to the second contact.

A first aspect of the invention provides a method of packaging a two terminal device, the method comprising: patterning a metal sheet to include a plurality of openings; bonding at least one two terminal device to the metal sheet, wherein a first opening corresponds to a distance between a first contact and a second contact of the at least one two terminal device; and cutting the metal sheet around each of the least one two terminal device, wherein the metal sheet forms a first electrode to the first contact and a second electrode to the second contact.

A second aspect of the invention provides a method of packaging a two terminal light emitting diode (LED) device, the method comprising: patterning a metal sheet to include a plurality of openings; bonding a plurality of LED devices to the metal sheet, wherein a first opening corresponds to a distance between a first contact and a second contact of at least one of the LED devices, and a second opening corresponds to a distance between a first LED device and a second LED device; and cutting the metal sheet around each of the LED devices, wherein the metal sheet forms a first electrode to the first contact and a second electrode to the second contact.

A third aspect of the invention provides a two terminal light emitting diode (LED) package array, comprising: a wafer including a plurality of two terminal LED devices; and a metal sheet patterned to include a plurality of openings, wherein the metal sheet is bonded to the plurality of two terminal LED devices to form a first electrode and a second electrode for each of the plurality of two terminal LED devices, such that a first opening of the metal sheet corresponds to a distance between a first contact and a second contact of at least one of the LED devices and a second opening corresponds to a distance between a first LED device and a second LED device.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 4 shows an illustrative LED package array according to an embodiment.

FIG. 5 shows an illustrative LED package array according to an embodiment.

FIGS. 6A and 6B show illustrative LED package arrays according to embodiments, while

FIG. 8 shows an illustrative package array according to an embodiment.

FIGS. 14A-14B show illustrative packaged two terminal devices according to an embodiment.

FIGS. 15A-15D show illustrative packaged two terminal devices according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide an improved solution for packaging a two terminal device, such as a LED. In one embodiment, a method of packaging a two terminal device includes: patterning a metal sheet to include a plurality of openings; bonding at least one two terminal device to the metal sheet, wherein a first opening corresponds to a distance between a first contact and a second contact of the at least one two terminal device; and cutting the metal sheet around each of the least one two terminal device, wherein the metal sheet forms a first electrode to the first contact and a second electrode to the second contact. As used herein, unless otherwise noted, the term "set" means one or more (i.e., at least one) and the phrase "any solution" means any now known or later developed solution.

Figure 1:
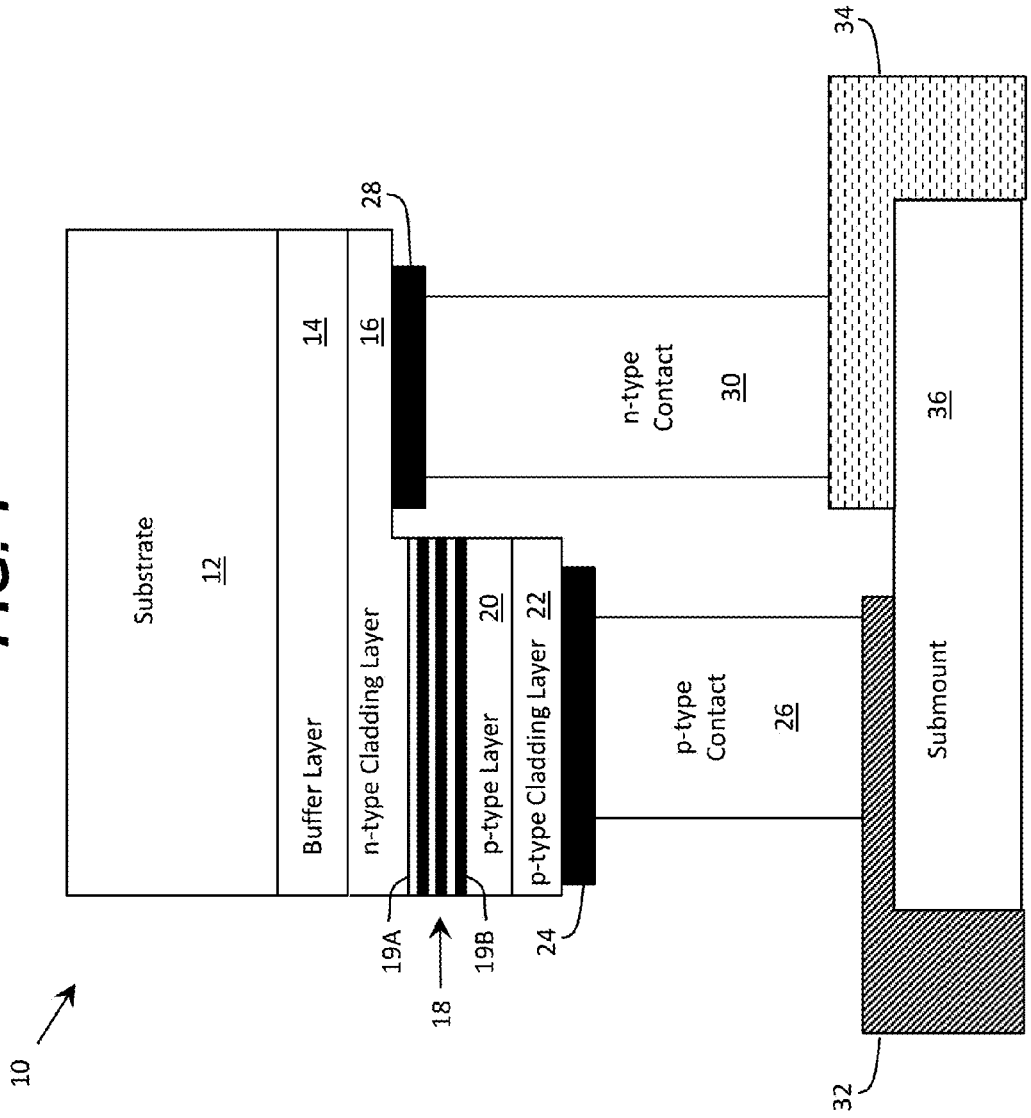
FIG. 1 shows a schematic structure of an illustrative emitting device according to an embodiment.

Turning to the drawings, FIG. 1 shows a schematic structure of an illustrative two terminal emitting device 10 according to an embodiment. In an embodiment, the emitting device 10 is configured to operate as a light emitting diode (LED). Alternatively, the emitting device 10 can be configured to operate as a laser diode (LD). In either case, during operation of the emitting device 10, application of a bias comparable to the band gap results in the emission of electromagnetic radiation from an active region 18 of the emitting device 10. The electromagnetic radiation emitted by the emitting device 10 can comprise a peak wavelength within any range of wavelengths, including visible light, ultraviolet radiation, deep ultraviolet radiation, infrared light, and/or the like.

The emitting device 10 includes a substrate 12, a buffer layer 14 adjacent to the substrate 12, an n-type cladding layer 16 adjacent to the buffer layer 14, and an active region 18 having an n-type side 19A adjacent to the n-type cladding layer 16. Furthermore, the emitting device 10 includes a p-type layer 20 adjacent to a p-type side 19B of the active region 18 and a p-type cladding layer 22 adjacent to the p-type layer 20.

In a more particular illustrative embodiment, the emitting device 10 is a group III-V materials based device, in which some or all of the various layers are formed of elements selected from the group III-V materials system. In a still more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 includes an active region 18 composed of $In_y Al_x Ga_{1-x-y} N$, $Ga_z In_y Al_x B_{1-x-y} N$, an $Al_x Ga_{1-x} N$ semiconductor alloy, or the like. Similarly, both the n-type cladding layer 16 and the p-type layer 20 can be composed of an $In_y Al_x Ga_{1-x-y} N$ alloy, a $Ga_z In_y Al_x B_{1-x-y} N$ alloy, or the like.

The molar fractions given by x, y, and z can vary between the various layers 16, 18, and 20. The substrate 12 can be sapphire, silicon carbide (SiC), silicon (Si), GaN, AlGaN, AlON, $LiGaO_2$, or another suitable material, and the buffer layer 14 can be composed of AlN, an AlGaN/AlN superlattice, and/or the like.

As shown with respect to the emitting device 10, a p-type metal 24 can be attached to the p-type cladding layer 22 and a p-type contact 26 can be attached to the p-type metal 24. Similarly, an n-type metal 28 can be attached to the n-type cladding layer 16 and an n-type contact 30 can be attached to the n-type metal 28. The p-type metal 24 and the n-type metal 28 can form ohmic contacts to the corresponding layers 22, 16, respectively.

As further shown with respect to the emitting device 10, the device 10 can be mounted to a submount 36 via contacts 26, 30. In this case, the substrate 12 is located on the top of the emitting device 10 in a flip chip configuration. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like. Regardless, it is understood that emitting device 10 is only illustrative of various types of devices, which can be packaged in a flip chip configuration.

An embodiment provides a solution for packaging two terminal devices, such as a two terminal LED, that is applicable to an environment where a large number of devices are epitaxially grown on a wafer. For example, a packaging solution described herein can be implemented in an environment where at least ten devices are grown on a wafer. During the epitaxial growth, the device die 10 is formed. Subsequently, the device die 10 can be placed on a submount 36 via contact pads 32, 34. It is understood that FIG. 1 illustrates a flip-chip LED design, where most of the emission occurs through the substrate 12.

Figure 2:
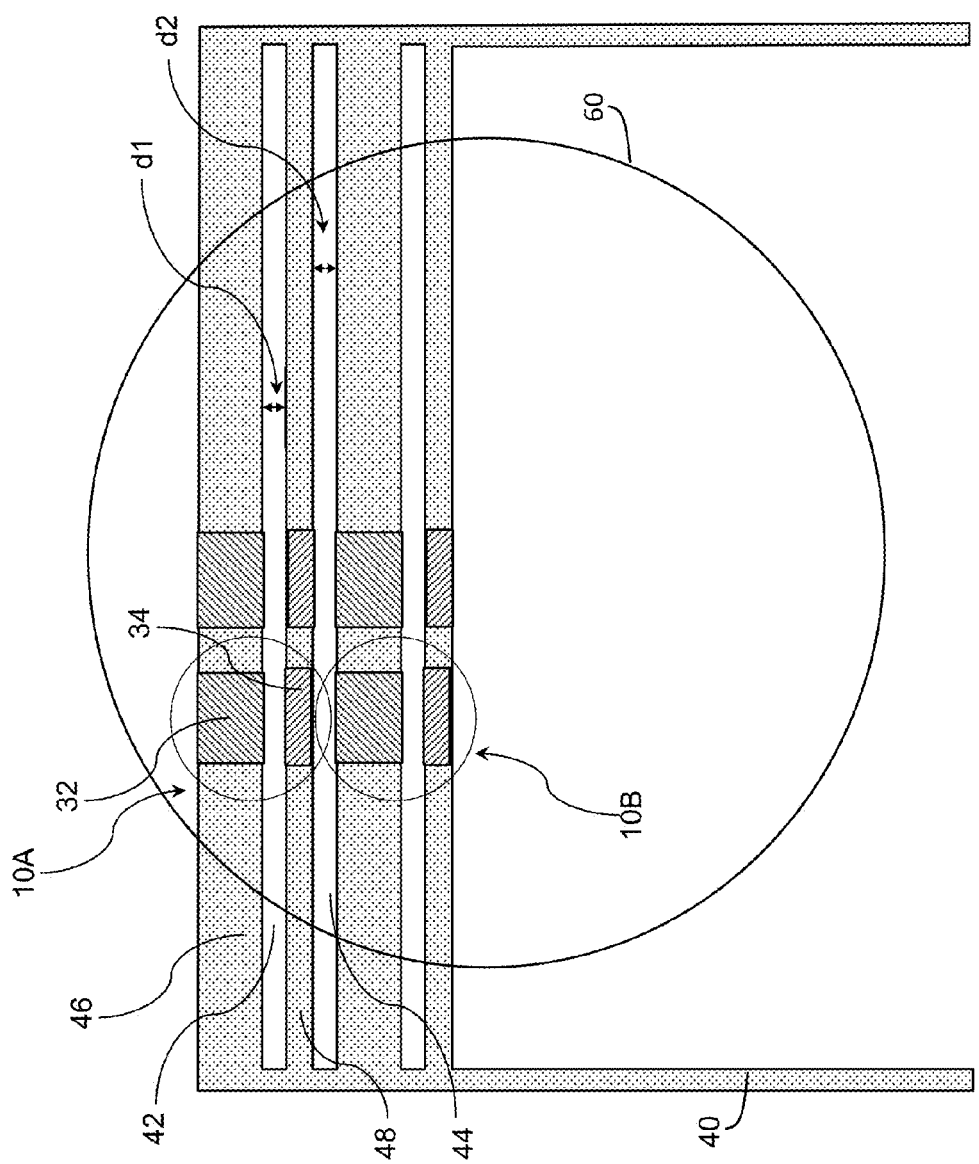
FIG. 2 shows an illustrative metal sheet bonded to a wafer according to an embodiment.

To package a plurality of two terminal devices, a metal sheet is provided to form electrodes for each of the two terminal devices. FIG. 2 shows an illustrative metal sheet 40 for packaging two terminal devices according to an embodiment. The metal sheet 40 can comprise any conductive metal that is designed for forming electrodes to the two terminal devices. For example, the metal sheet 40 can comprise copper or aluminum. A size of the metal sheet 40 can be selected to be at least the size of the wafer 60 that includes the plurality of two terminal devices 10A, 10B. In one embodiment, the size of the metal sheet 40 exceeds the diameter of the wafer 60.

To form the electrodes for each of the two terminal devices 10, the metal sheet 40 is patterned to include a plurality of openings. For example, the metal sheet 40 is patterned to include a first opening 42 and a second opening 44. The metal sheet 40 can be manufactured to include the pattern of the plurality of openings. The width $d_1$ of the first opening 42 corresponds to a distance between a first contact (e.g., p-contact 32) and a second contact (e.g., n-contact 34) of a two terminal device 10A. The width $d_2$ of the second opening 44 corresponds to a distance between contacts of a first two terminal device 10A and a second two terminal device 10B. Although the wafer 60 is shown to only include four two terminal devices, it is understood that the wafer 60 can include any number of two terminal devices. To this extent, the metal sheet 40 can include any number of openings, each of which can have any width based on the corresponding two terminal device(s) and the distance between adjacent devices according to the device locations on the wafer 60. In an embodiment, the metal sheet 40 includes a pattern of alternating openings 42, 44.

Once the metal sheet 40 is patterned, the patterned metal sheet 40 is bonded to the plurality of two terminal devices 10A, 10B on the wafer 60. The patterned metal sheet 40 can be bonded to the plurality of two terminal devices 10A, 10B using any known technique. For example, the patterned metal sheet 40 can be die bonded to the plurality of two terminal devices 10A, 10B. In bonding the patterned metal sheet 40 to the plurality of two terminal devices 10A, 10B, since the plurality of two terminal devices 10A, 10B are located on the wafer 60 in a periodic arrangement, a first contact strip 46 is bonded to a first contact (e.g., p-contact 32) of a device 10A, and a second contact strip 48 is bonded to a second contact (e.g., n-contact 34) of the device 10A. The plurality of openings 42, 44 are matched to the arrangement of the plurality of devices 10A, 10B on the wafer 60.

Figure 3:
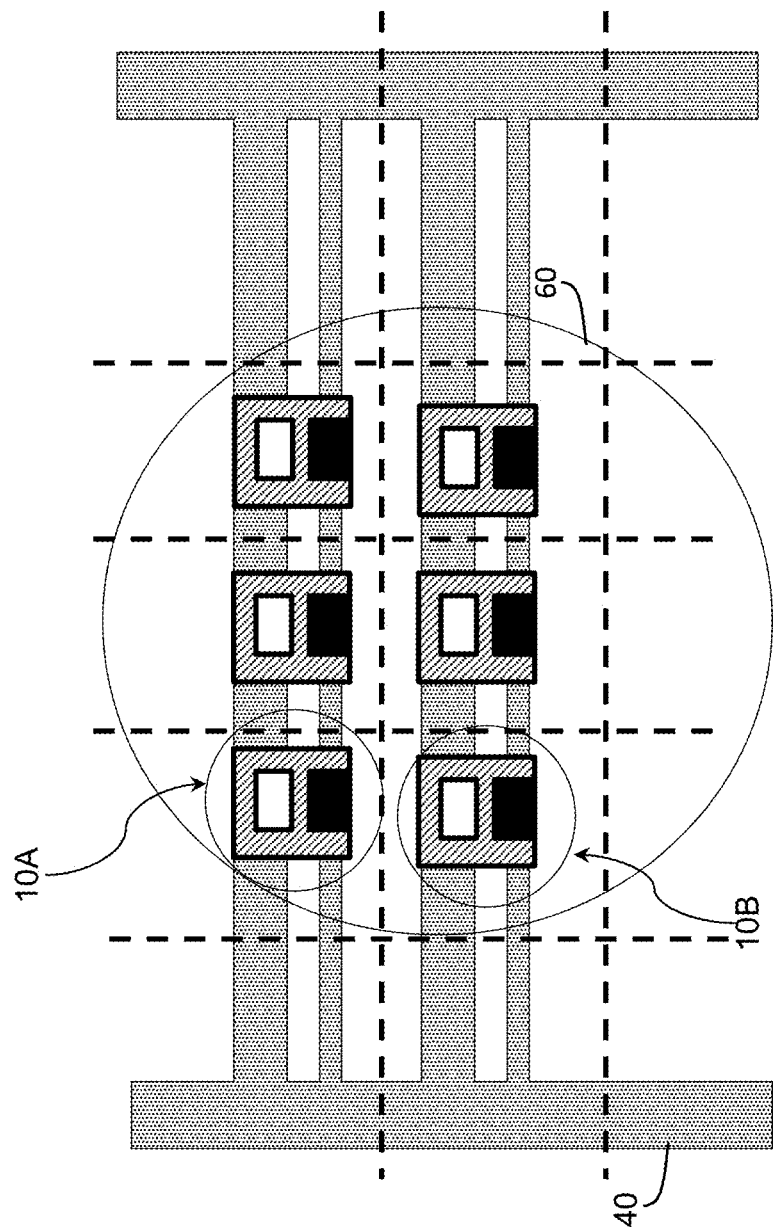
FIG. 3 shows an illustrative LED package array according to an embodiment.

Once the patterned metal sheet 40 is bonded to the plurality of two terminal devices 10A, 10B on the wafer 60, the metal sheet 40 can be cut around each of the two terminal devices 10A, 10B. For example, as illustrated in FIG. 3, the patterned metal sheet 40 can be cut along the dotted lines to produce individual two terminal devices 10A, 10B that are connected to electrodes (via the metal sheet 40).

In an embodiment, the patterned metal sheet 40 can be cut so that groups of two terminal devices are connected in parallel or series in order to create, for example, multi-LEDs lamps. For example, turning to FIG. 4, the metal sheet 40 can be cut along the dotted lines to create two groups of devices 72, 74. Each group of devices 72, 74 includes a plurality of devices connected in parallel. For example, a first group 72 includes devices 10A-C connected in parallel and a second group 74 includes devices 10D-F connected in parallel. Although each group 72, 74 is shown to include three devices connected in parallel, it is understood that a group can include any number of one or more devices.

Figure 6A:
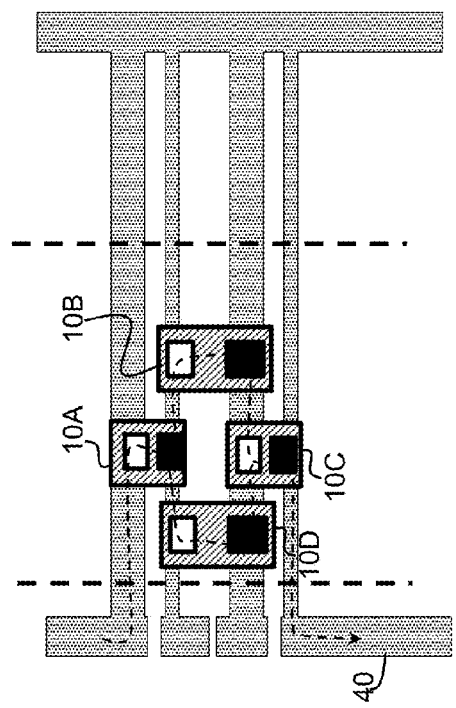
Figure 6B:
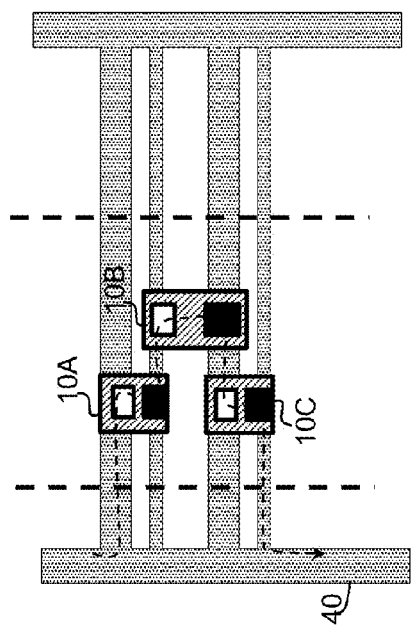
Figure 6C:
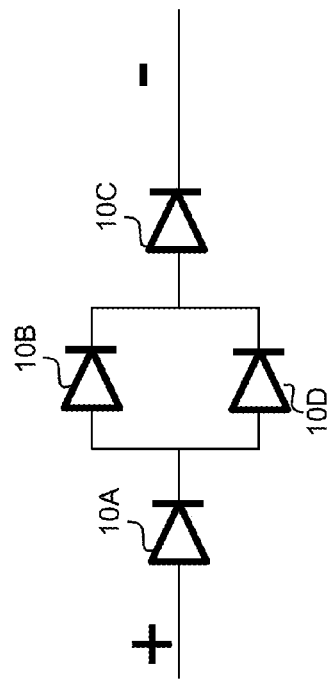
FIGS. 6C and 6D show the corresponding schematics, respectively.
Figure 6D:
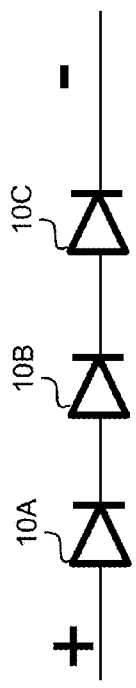

The patterned metal sheet 40 can also be cut so that a group of devices are connected in series. For example, turning to FIG. 5, the metal sheet 40 is cut along the dotted lines to create three groups of devices 72, 74, 76. The first group 72 and the second group 74 of devices includes a plurality of devices connected in parallel. The first group 72 includes devices 10B-10C connected in parallel and the second group 74 includes devices 10E-10F connected in parallel. The third group 76 includes devices 10A, 10D connected in series. The configuration of the devices (e.g., in parallel and/or in series) depends on the desired application for the electronic circuit. FIG. 6A shows another example of an illustrative configuration of devices 10A-C on a metal sheet 40, where the devices 10A-C are connected in series. In FIG. 6A, the devices 10A-C are connected in series, as shown in the schematic illustration of FIG. 6C. A difference in the configuration of FIG. 6A as compared to the configuration shown in FIG. 5 is that more devices can be assembled per unit area of the circuit in FIG. 5. FIG. 6B shows another example of an illustrative configuration of devices 10A-D on a metal sheet 40, in which the devices are connected in parallel and in series. FIG. 6D shows the schematic illustration of FIG. 6B.

Figure 7D:
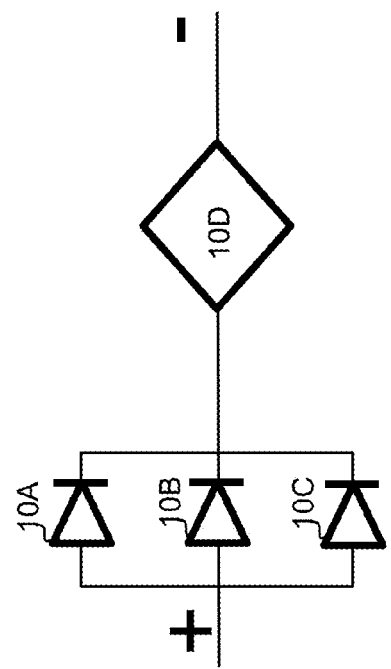
FIG. 7D shows an illustrative system according to an embodiment.
Figure 7C:
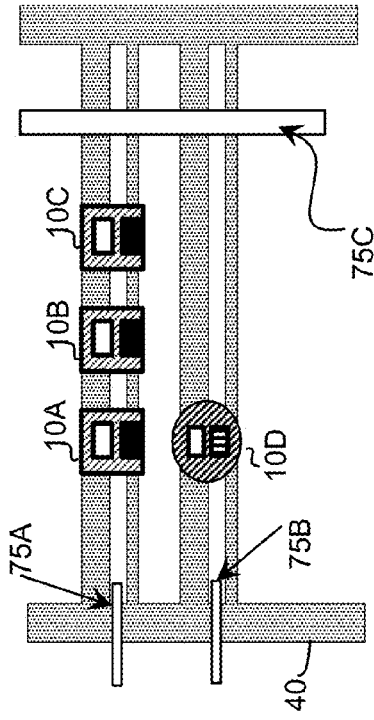
FIG. 7C shows the corresponding schematic of FIG. 7B.
Figure 7A:
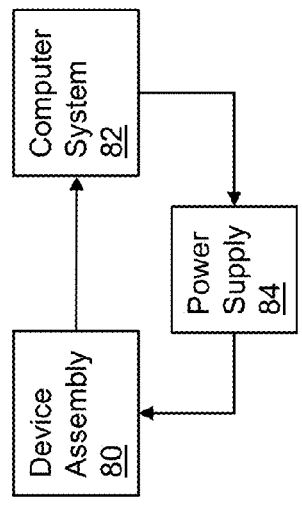
FIG. 7A shows an illustrative package array according to an embodiment.
Figure 7B:
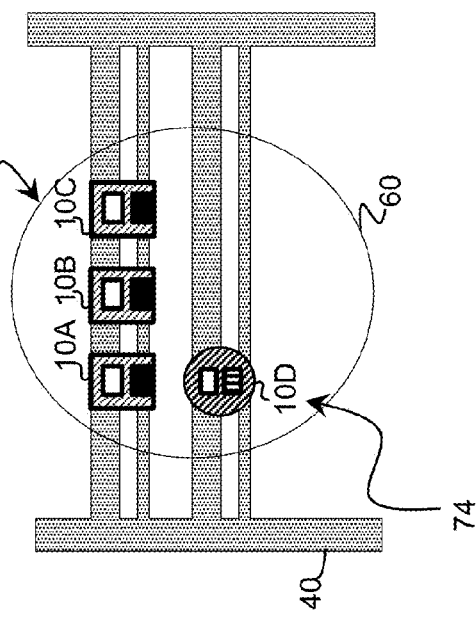
FIG. 7B shows the illustrative package array of FIG. 7A including a plurality of cuts.

A group of devices located on the patterned metal sheet 40 can include any combination of one or more types of devices. For example, a device can be an LED, a LD, a sensor, and/or the like. Turning now to FIG. 7A, an illustrative LED package array including at least one sensor according to an embodiment is shown. The array of devices includes a sensor 10D located on the metal sheet 40, while devices 10A-C are LEDs. The devices 10A-C are shown in the first group of devices 72, while the sensor 10D is shown in the second group of devices 74. It is understood that each group of devices 72, 74 can include any number of devices. The sensor 10D can be configured to form a feedback system for controlling the devices 10A-C. Depending on how the metal sheet 40 is cut, a different circuit can be formed. For example, turning to FIG. 7B, the metal sheet 40 is cut along lines 75A, 75B, 75C. The schematic illustration of this circuit is shown in FIG. 7C. It is understood that other circuit configurations are possible, depending on the type of cut lines performed on the metal sheet through the network of devices. Turning now to FIG. 7D, an illustrative system according to an embodiment is shown. The device assembly 80 can comprise an assembly that includes at least one sensor 10D shown in FIG. 7A. A computer system 82 can be configured to receive the output of the sensor 10D in the device assembly 82 and include at least one module for optimizing the emitted radiation from the devices 10A-C. The computer system 82 can be configured to adjust the output of a power supply 84 in order to control the devices 10A-C in the device assembly 80.

Figure 9:
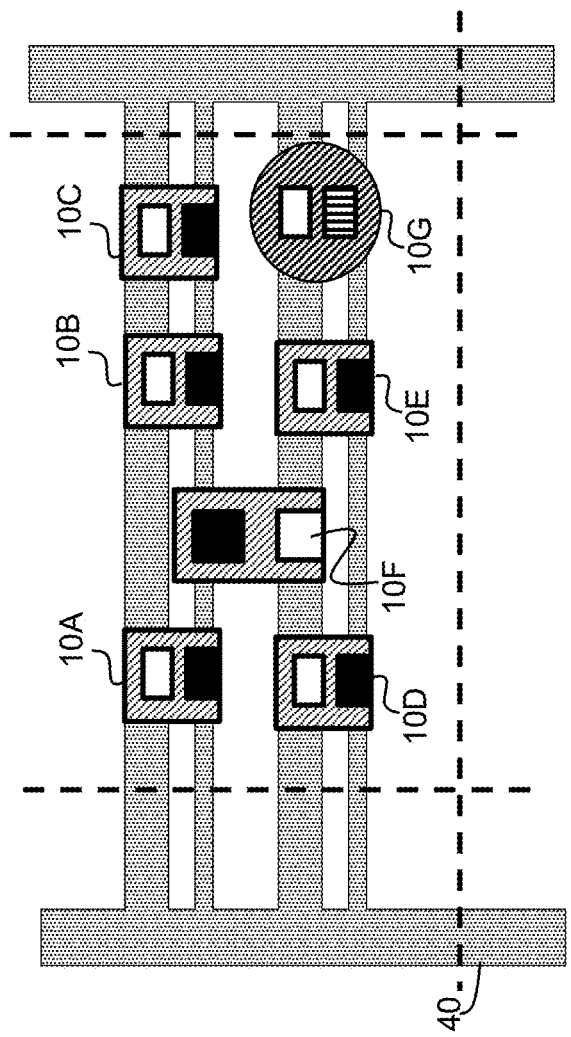
FIG. 9 shows an illustrative package array according to an embodiment.

The devices located on the metal sheet 40 can include one or more three terminal devices, such as transistors, and/or the like. Turning now to FIG. 8, an illustrative package array according to an embodiment is shown. The device 10 shown in FIG. 8 has three terminals that are each bonded to a unique contact strip 46, 48, 49, respectively. A first terminal T1 and a second terminal T2 of the device 10 is aligned with the first contact strip 46 and the second contact strip 48, respectively. Therefore, the space between a first contact strip 46 and a second contact strip 48 is approximately the same as the distance between the first terminal T1 and the second terminal T2. Additionally, the third terminal T3 is aligned with the third contact strip 49, so that the space between the second contact strip 48 and the third contact strip 49 is approximately the same as the distance between the second terminal T2 and the third terminal T3. Turning now to FIG. 9, an illustrative package array according to an embodiment is shown. In this embodiment, the devices 10A-10E can be two terminal devices, such as LEDs, while the device 10F can be a different type of two terminal device, such as a zener diode. Furthermore, the package array can include another type of two terminal device, such as a sensor 10G. It is understood that this is just another example of a possible circuit configuration. Other two terminal devices can include Schottky diodes, tunnel diodes, varactor diodes, photodiodes, solar cells, and/or the like.

Figure 10:
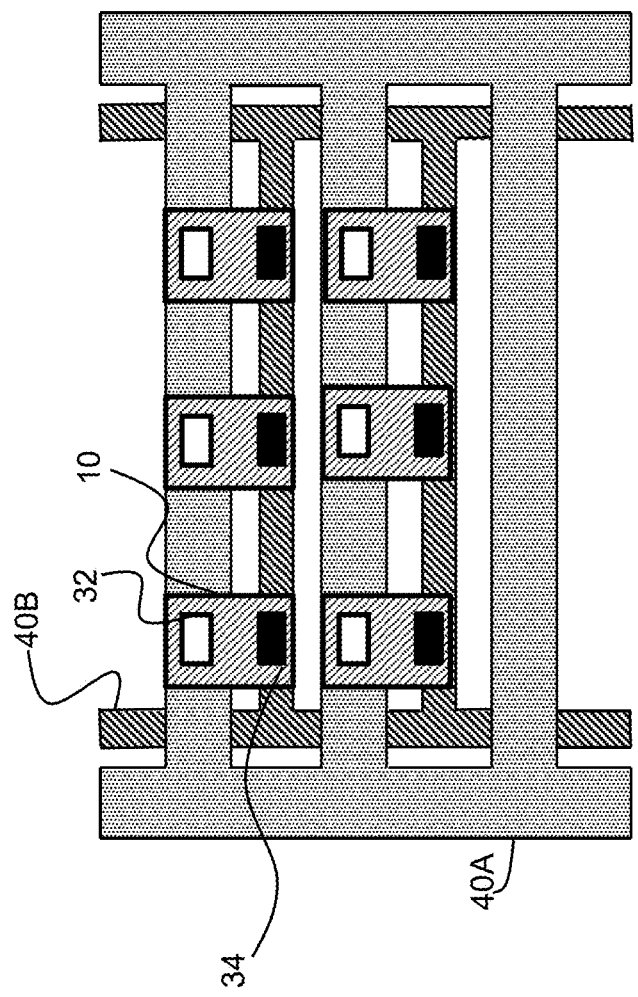
FIG. 10 shows an illustrative package array according to an embodiment.

Turning now to FIG. 10, an illustrative package array according to an embodiment is shown. In this embodiment, more than one metal sheet is provided to create the package array. Each metal sheet can be bonded to different contacts of the devices. For example, a first metal sheet 40A is provided for a first contact 32 of the device 10, while a second metal sheet 40B is provided for a second contact 34. In an embodiment, the first metal sheet 40A and the second metal sheet 40B can be separated by an insulating material, such as silicon dioxide ($SiO_2$), silicon nitride ($Si_3N_4$), and/or the like, in order to prevent an electrical short in the package array. This configuration can be beneficial as it requires less cuts through the network of devices. For example, in the configuration shown in FIG. 10, the devices 10 are in parallel and require no additional cutting. It is further understood that the first metal sheet 40A and the second metal sheet 40B can have different metallic properties. For example, the first metal sheet 40A can be made from a first material and the second metal sheet 40B can be made from a second material.

Figure 11:
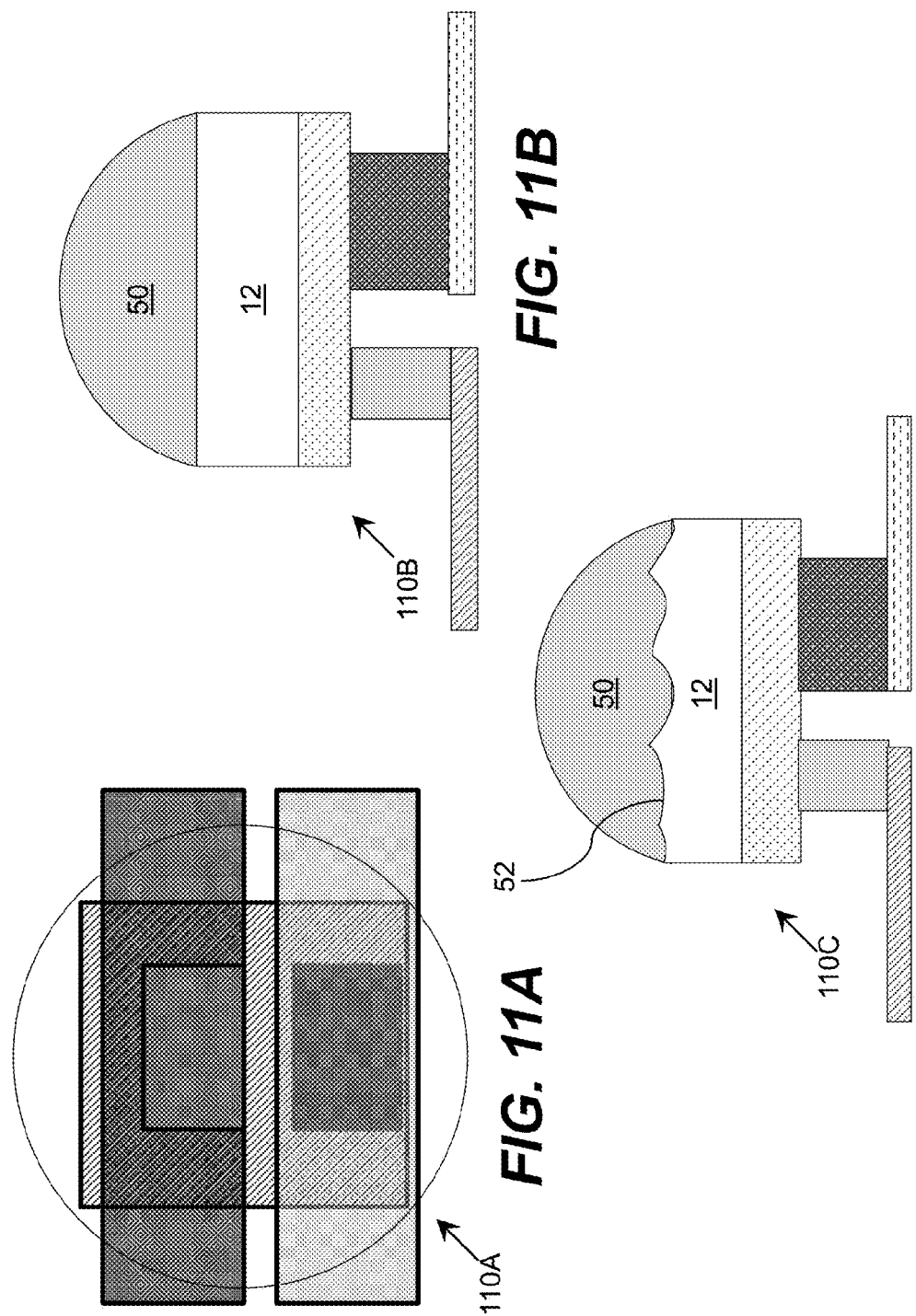
FIGS. 11A-11C show illustrative packaged two terminal devices according to an embodiment.

A device can undergo additional processing after the patterned metal sheet 40 is bonded to the devices 10A, 10B. For example, turning now to FIGS. 11A-11C, illustrative packaged two terminal devices 110A-110C are shown. Once each individual LED device 110A-110C is cut out, an encapsulant 50 can be placed onto the substrate 12 of the LED device 110A-110C using any solution. Alternatively, each LED device 110A-110C can be encapsulated prior to cutting each LED device 110A-110C out. FIG. 11A illustrates a top view of an illustrative two terminal LED device 110A. FIG. 11B illustrates a cross sectional view of a two terminal LED device 10 including the encapsulant 50.

The encapsulant 50 can comprise any type of material, which can be configured to improve light extraction from the LED device 10. For example, the encapsulant 50 can comprise a material that is index matched in order to decrease a total internal reflection from the device surfaces. An illustrative material is an epoxy resin material. In another embodiment, the encapsulant 50 is formed of a composite material including a matrix material and at least one filler material incorporated in the matrix material as shown and described in U.S. Patent Application Publication No. 2013/0078411, which is incorporated herein by reference.

FIG. 11C illustrates an alternative embodiment of the two terminal LED device 110C. In this embodiment, prior to depositing the encapsulant 50 onto the substrate 12, a surface 52 of the substrate 12 can be roughened to increase light extraction efficiency of the LED device 110C. To this extent, the roughness can be formed using any combination of deposition and/or etching. For example, an illustrative roughening includes selective deposition and/or etching of nanoscale objects, such as nanodots and/or nanorods, of the substrate material to form large scale (e.g., a characteristic scale an order of magnitude larger than a wavelength of the LED device) and/or small scale (e.g., a characteristic scale on the order of the wavelength of the LED device) roughness components. Such deposition and/or etching can be used to form periodic and/or non-periodic random patterns on the surface 52 of the substrate 12.

Figure 12:
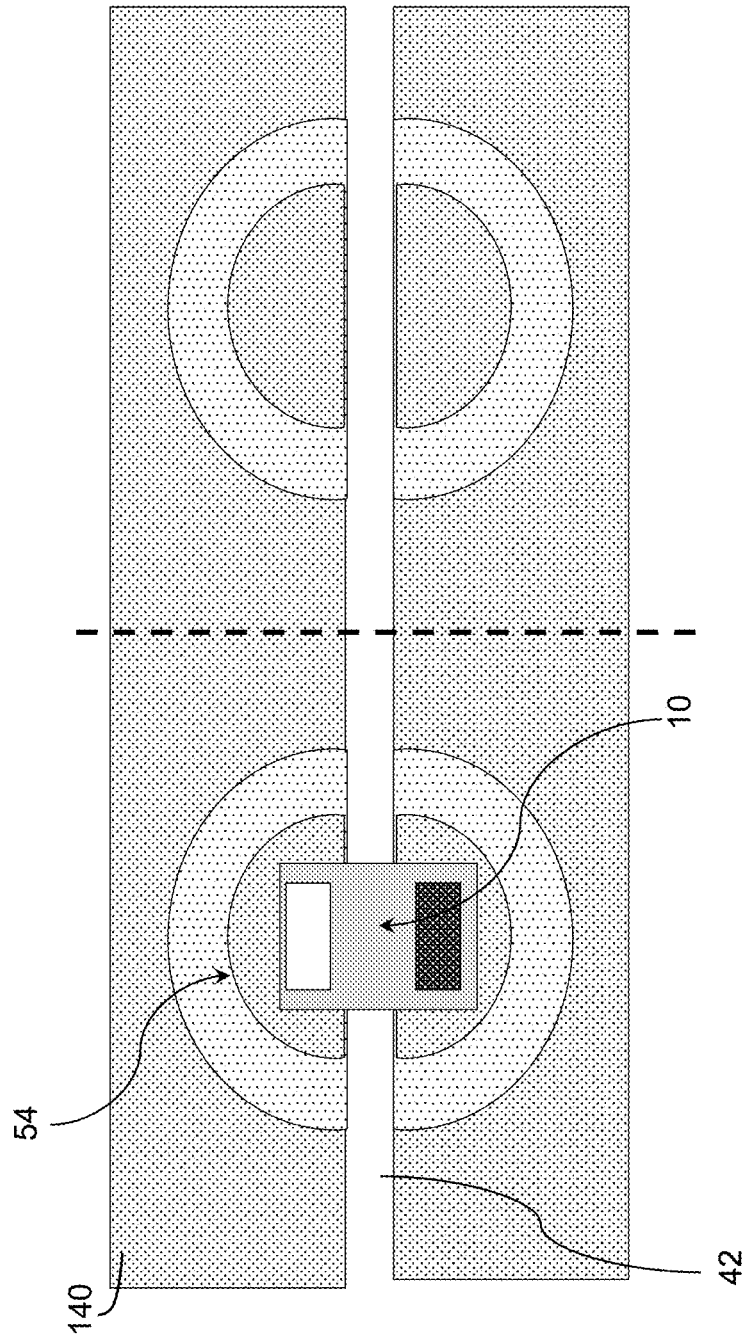
FIG. 12 shows an illustrative packaged two terminal device within a three dimensional depression according to an embodiment.

In an embodiment illustrated in FIG. 12, a metal sheet 140 can be imprinted to include a three-dimensional depression 54 for accommodating the two terminal device 10. The metal sheet 140 can be imprinted using any known technique. For example, the metal sheet 140 can be imprinted using metal stamping. The metal sheet 140 can be imprinted prior to cutting the plurality of openings 42, 44 or after cutting the plurality of openings 42, 44.

Figure 13B:
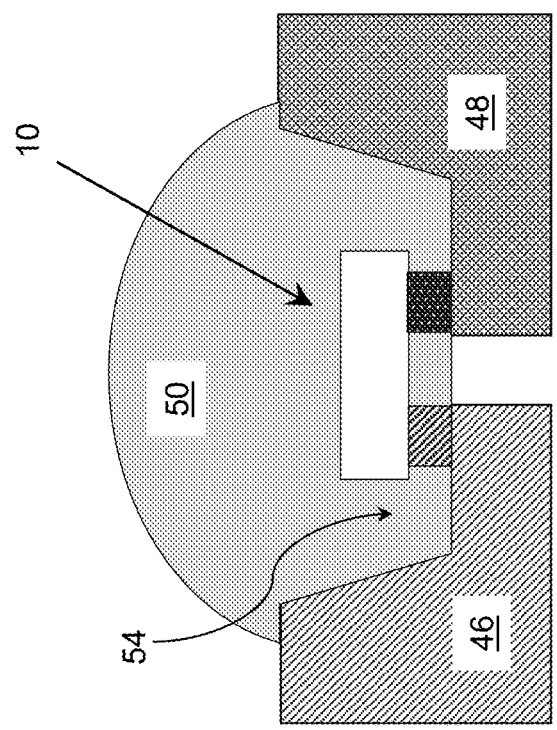
FIGS. 13A-13B show illustrative packaged two terminal devices according to an embodiment.
Figure 13A:
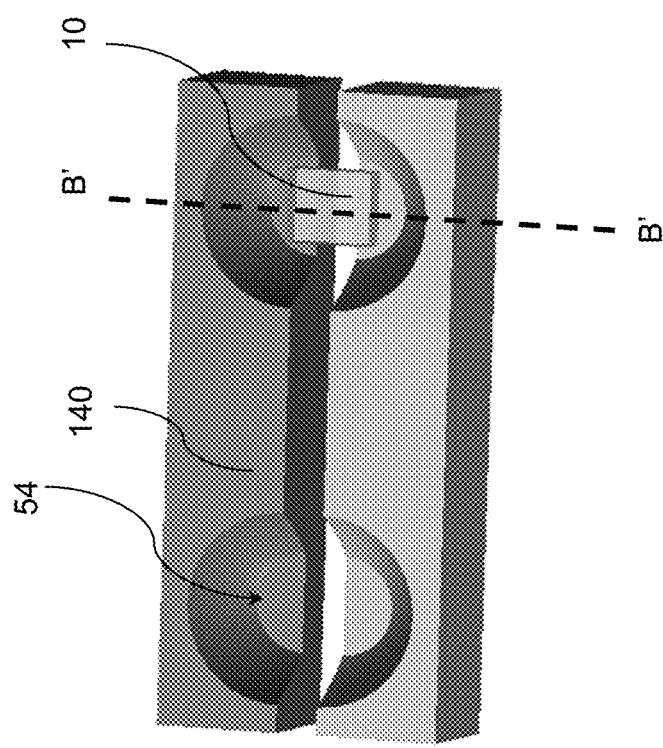

Turning now to FIG. 13A, a partial three-dimensional view of the metal sheet 140 including the three-dimensional depression 54 is shown. FIG. 13B shows a cross sectional view of a two terminal device 10 cut along line B'-B'. The two terminal device 10 is positioned at the bottom of the three-dimensional depression 54. The three-dimensional depression 54 helps to reflect light emitted from a two terminal device 10 operating as an LED or the like. The surface of the three-dimensional depression 54 can be at least 50% reflective for the wavelength emitted by the LED device 10.

Although FIG. 13B shows the three-dimensional depression 54 to be a trapezoidal shape, it is understood that the three-dimensional depression 54 can include any shape. For example, as seen in FIG. 15A, the three-dimensional depression 54 can include curved sides. The encapsulant 50 can fill substantially all of the enclosure formed by the three-dimensional depression 54.

In an embodiment, a dielectric layer can be deposited within the first opening 42 between the first contact strip 46 and the second contact strip 48. The dielectric layer 62 can include one or more dielectric materials. For example, the dielectric layer 62 shown in FIG. 14A includes three layers. The dielectric layer 62 can provide room for thermal expansion of the first contact strip 46 and the second contact strip 48. Turning now to FIG. 14B, a dielectric layer 63 can be deposited within the first opening 42 between a first device 10A and a second device 10B. This dielectric layer 63 also can include one or more dielectric materials for device isolation.

FIGS. 15A-15D illustrate alternative embodiments of packaged LED devices. As mentioned above, FIG. 15A illustrates a three-dimensional depression 54 that includes curved sides. It is understood that the three-dimensional depression 54 can include any profile. In FIG. 15B, the three-dimensional depression 154 can include a reflective coating 64. The reflective coating 64 is on the surfaces of the three-dimensional depression 154 that do not contact the LED device 10. The reflective coating 64 can help to further reflect light emitted from the LED device 10. The reflective coating 64 can include a thermally conductive material with a thermal conductivity coefficient exceeding 10 W/km. In an embodiment, the reflective coating 64 comprises aluminum. A material reflective of ultraviolet radiation also can be utilized. For example, illustrative ultraviolet reflective materials include: polished aluminum, a highly ultraviolet reflective expanding polytetrafluoroethylene (ePTFE) membrane (e.g., GORE® DRP® Diffuse Reflector Material), a fluoropolymer (e.g., Spectralon® by Labsphere, Inc.), and/or the like. Regardless, the reflective material can comprise a coating applied to an underlying substrate material.

The packaged LED device can include fluorescent material to indicate the on/off state of the LED device 10. In one embodiment, in FIG. 15C, a hole 66 can be formed within one of the contact strips 46, 48. For example, as shown in FIG. 15C, a hole 66 is shown formed within the second contact strip 48. The hole 66 also can extend through the reflective coating 64. The hole 66 can be filled with a fluorescent material, such as phosphors (e.g., such as those used in white light emitting diodes), semiconductor quantum dots having a band gap smaller than the radiation emitted by the LED device 10 (e.g., in visible wavelengths), and/or the like. When light is generated by the LED device 10, the light can be observed through the hole 66. For example, if LED device 10 is an ultraviolet LED that emits non-visible light, the fluorescent material within the hole 66 can be an indicator of the on/off state of the LED device 10. In an alternative embodiment, in FIG. 15D, pockets 68 of fluorescent material can be placed on the reflective coating 64. These pockets 68 of fluorescent material can be used to indicate the on/off state of the LED device 10 or for providing visible light emission.

Figure 16:
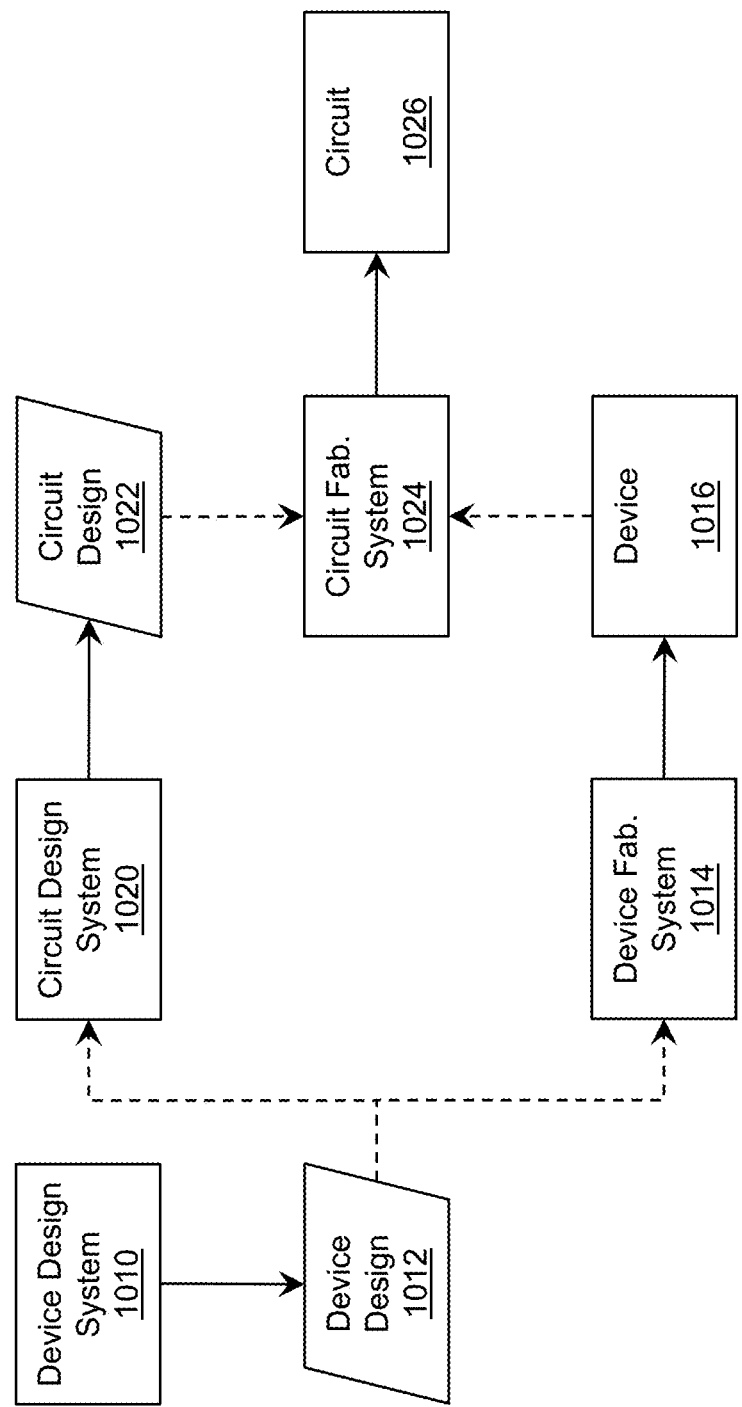
FIG. 16 shows an illustrative flow diagram for fabricating a circuit according to an embodiment.

In an embodiment, the invention provides a method of designing and/or fabricating a circuit that includes one or more of the devices designed and fabricated as described herein. To this extent, FIG. 16 shows an illustrative flow diagram for fabricating a circuit 1026 according to an embodiment. Initially, a user can utilize a device design system 1010 to generate a device design 1012 for a semiconductor device as described herein. The device design 1012 can comprise program code, which can be used by a device fabrication system 1014 to generate a set of physical devices 1016 according to the features defined by the device design 1012. Similarly, the device design 1012 can be provided to a circuit design system 1020 (e.g., as an available component for use in circuits), which a user can utilize to generate a circuit design 1022 (e.g., by connecting one or more inputs and outputs to various devices included in a circuit). The circuit design 1022 can comprise program code that includes a device designed as described herein. In any event, the circuit design 1022 and/or one or more physical devices 1016 can be provided to a circuit fabrication system 1024, which can generate a physical circuit 1026 according to the circuit design 1022. The physical circuit 1026 can include one or more devices 1016 designed as described herein.

In another embodiment, the invention provides a device design system 1010 for designing and/or a device fabrication system 1014 for fabricating a semiconductor device 1016 as described herein. In this case, the system 1010, 1014 can comprise a general purpose computing device, which is programmed to implement a method of designing and/or fabricating the semiconductor device 1016 as described herein. Similarly, an embodiment of the invention provides a circuit design system 1020 for designing and/or a circuit fabrication system 1024 for fabricating a circuit 1026 that includes at least one device 1016 designed and/or fabricated as described herein. In this case, the system 1020, 1024 can comprise a general purpose computing device, which is programmed to implement a method of designing and/or fabricating the circuit 1026 including at least one semiconductor device 1016 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 1010 to generate the device design 1012 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 1010 for designing and/or a device fabrication system 1014 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of packaging a plurality of devices, the method comprising:

bonding a first device and a second device to a metal sheet, wherein the metal sheet includes a plurality of openings extending through the metal sheet, wherein the plurality of openings includes:

a first set of openings, each opening in the first set of openings having a width substantially similar to a distance between a first electrode and a second electrode of the first device; and a second set of openings, each opening in the second set of openings having a width substantially similar to a distance between one of: the first electrode or the second electrode of the first device and an adjacent electrode of the second device, wherein the first device is located over a first opening in the first set of openings such that a first contact and a second contact of the first device are directly bonded to the metal sheet on opposing sides of the first opening and wherein one of: the first contact or the second contact of the first device and an adjacent contact of the second device are bonded to the metal sheet on opposing sides of a second opening in the second set of openings, wherein the bonded metal sheet forms electrodes to contacts of each device.

2. The method of claim 1, further comprising cutting the metal sheet, wherein the cutting the metal sheet forms a group of devices, such that the first and second devices are in parallel.

3. The method of claim 1, further comprising bonding a third device to the metal sheet, wherein the third device is located over the first opening in the first set of openings such that a first contact and a second contact of the third device are directly bonded to the metal sheet on opposing sides of the first opening.

4. The method of claim 3, further comprising cutting the metal sheet, wherein the cutting the metal sheet forms a group of devices, such that the first and third devices are in series.

5. The method of claim 1, wherein at least one of the plurality of devices is a two terminal device, wherein the two terminal device is one of: a light-emitting diode, a laser diode, a zener diode, or a sensor.

6. The method of claim 1, wherein at least one of the plurality of devices includes a three terminal device, and the bonding further comprises bonding the three terminal device to the metal sheet, wherein the width of the first set of openings is substantially similar to a distance between a first electrode and a second electrode of the three terminal device, and the width of the second set of openings is substantially similar to a distance between the second electrode and a third electrode of the three terminal device.

7. The method of claim 6, further comprising:
patterning the metal sheet and a second metal sheet, each metal sheet including the plurality of openings, wherein a size of the metal sheet and a size of the second metal sheet are substantially similar to the size of a wafer including the plurality of devices.

8. The method of claim 7, wherein the metal sheet and the second metal sheet are separated by an insulating material.

9. The method of claim 1, wherein the width of the second set of openings is substantially similar to a distance between a first electrode and a second electrode of a third device.

10. A method of packaging a plurality of devices, the method comprising:
bonding the plurality of devices to a metal sheet including a plurality of openings extending through the metal sheet, wherein the plurality of openings includes:
a first set of openings, each opening in the first set of openings having a width substantially similar to a distance between a first electrode and a second electrode of a first device; and
a second set of openings, each opening in the second set of openings having a width substantially similar to a target distance between the first or second electrode of the first device and an adjacent electrode of a second device, wherein the first set of openings alternate with the second set of openings; and
wherein the first device is located over a first opening in the first set of openings such that a first contact and a second contact of the first device are directly bonded to the metal sheet on opposing sides of the first opening and wherein the first or second electrode of the first device and an adjacent contact of the second device are bonded to the metal sheet on opposing sides of a second opening in the second set of openings, wherein the bonded metal sheet forms electrodes to contacts of each device.

11. The method of claim 10, further comprising cutting the metal sheet, wherein the cutting the metal sheet forms a group of devices, such that the first and second devices are in parallel.

12. The method of claim 10, further comprising bonding a third device to the metal sheet, wherein the third device is located over the first opening in the first set of openings such that a first contact and a second contact of the third device are directly bonded to the metal sheet on opposing sides of the first opening.

13. The method of claim 12, further comprising cutting the metal sheet, wherein the cutting the metal sheet forms a group of devices, such that the first and third devices are in series.

14. The method of claim 10, wherein at least one of the plurality of devices includes a two terminal device, wherein the two terminal device is one of: a light-emitting diode, a laser diode, a zener diode, or a sensor.

15. The method of claim 10, wherein at least one of the plurality of devices includes a three terminal device, and the bonding further comprises bonding the three terminal device to the metal sheet, wherein the width of the first set of openings is substantially similar to a distance between a first electrode and a second electrode of the three terminal device, and the width of the second set of openings is substantially similar to a distance between the second electrode and a third electrode of the three terminal device.

16. The method of claim 10, further comprising:
patterning the metal sheet and a second metal sheet, each metal sheet including the plurality of openings, wherein a size of the metal sheet and a size of the second metal sheet are substantially similar to the size of a wafer including the plurality of devices.

17. The method of claim 16, wherein the metal sheet and the second metal sheet are separated by an insulating material.

18. The method of claim 10, wherein the width of the second set of openings is substantially similar to a distance between a first electrode and a second electrode of a third device.

* * * * *